United States Patent [19]

Odone et al.

[11] 4,180,774
[45] Dec. 25, 1979

[54] REGENERATIVE METHOD AND APPARATUS TO CONTROL AN ELASTIC RESET TORQUE IN MOVABLE APPARATUS

[75] Inventors: Giovanni Odone, Saint-Sulpice; Roland Cochard, Morges, both of Switzerland

[73] Assignee: Robert Bosch GmbH, Stuttgart, Fed. Rep. of Germany

[21] Appl. No.: 908,981

[22] Filed: May 24, 1978

[30] Foreign Application Priority Data

Jun. 2, 1977 [DE] Fed. Rep. of Germany ....... 2724811

[51] Int. Cl.² .................. G01R 1/30; G01R 1/38; H03F 1/40
[52] U.S. Cl. .................. 324/125; 318/640; 324/96; 324/123 R; 324/154 R; 330/112
[58] Field of Search .................. 324/125, 154 R, 157, 324/96, 123 R, 123 C, 115; 73/430; 318/630, 640; 330/112

[56] References Cited

U.S. PATENT DOCUMENTS

| 2,367,614 | 1/1945 | Rich | 324/125 |
| 3,435,341 | 3/1969 | Baron et al. | 324/96 |

Primary Examiner—Rudolph V. Rolinec
Assistant Examiner—Ernest F. Karlsen
Attorney, Agent, or Firm—Frishauf, Holtz, Goodman & Woodward

[57] ABSTRACT

The suspension of movable system instruments, for example, a galvanometer, introduces elastic reset torques upon deflection. To compensate for such torques and render the apparatus essentially independent of the deflection torques, an opto-electronic device provides an output signal representative of the deflection which is combined with the deflection voltage applied to the galvanometer to at least in part compensate for the reset torque introduced by the moving system suspension.

5 Claims, 2 Drawing Figures

REGENERATIVE METHOD AND APPARATUS TO CONTROL AN ELASTIC RESET TORQUE IN MOVABLE APPARATUS

The present invention relates to apparatus to compensate for the reset torque applied to elastically suspended movable systems, and more particularly to compensate for the elastic torque of galvanometer instruments, and the like, which are suspended by an elastic suspension element, rather than have their moving systems journaled in bearings.

BACKGROUND AND PRIOR ART

Galvanometers, basically, have their moving coils or moving systems secured in the instrument in two different ways. The general construction of the galvanometer need not be described since galvanometers of various types have been known for many decades. All mechanical constructions require a compromise between mechanical strength, and sturdiness on the one hand, and sensitivity of the instrument on the other. Thus, galvanometer coils operating in an magnetic field which are subject to shock or vibration, and thus must be reliably and sturdily mounted, usually have the moving system journaled in bearings. These bearings may be artificial jewels, the moving systems being provided with pointed pins which are journaled in the jewels, similar to watch movements. Current is supplied to the galvanometer coil by spiral springs. This arrangement, while providing good and reliable bearings for the movable system has the disadvantage that frictional forces are introduced which lower the sensitivity and accuracy of the instrument.

Instruments which meet the highest requirements regarding sensitivity have been proposed in which the movable galvanometer coil is suspended on a stretched metal ribbon. Such ribbon suspensions provide for a floating attachment of the galvanometer coil to a frame. The ribbons themselves provide the current supply to the frame. Upon deflection of the galvanometer coil, that is, when a current is passed through the coil which is placed in a magnetic field, the ribbons will twist and, due to the elasticity of the metal ribbons, will also provide the necessary reset torque. Such systems, while being sensitive, have the disadvantage that they are subject to shock or vibration. To provide even a reasonable degree of strength and sturdiness to such instruments, it is necessary that the stretching ribbons which hold the galvanometer frame have a certain thickness and width. Thus, the suspension ribbons cannot be made as thin as would be desirable and thus the reset torque cannot be decreased to the extent necessary merely to move the galvanometer coil and an associated indicating device. The sensitivity of the instrument thus is limited by the elasticity of the suspending ribbons which, due to the requirements of suitable mechanical strength, have a lower limit which cannot be passed.

THE INVENTION

It is an object to provide a suspension arrangement for a moving system in which reset torques, or return torques can be controlled, or compensated, and more particularly to provide a galvanometer suspension which is sturdy, without, however, interfering essentially with the deflection sensitivity of the instrument.

Briefly, an optical-electrical transducing system is coupled to the moving system of the device, or instrument typically the galvanometer, which provides an output signal representative of the deflection thereof. This output signal is combined with the deflection signal applied to the galvanometer in a direction to essentially counteract the restoring torque.

In accordance with a feature of the invention, the opto-electronic arrangement includes a light source and a photodetector, and a light gate located in the path of light between the source and the photodetector, so that the photodetector will provide an output signal which varies with the deflection of the moving system. The output signal from the photodetector can then be modified, for example, by a variable gain amplifier and added to the galvanometer control voltage in suitable manner to at least partially compensate the restoring torque applied to the moving system by the suspension thereof.

The system, and method of the present invention has the advantage that the moving system can be suspended by sturdy suspension elements which, when measuring current is interrupted, rapidly restore the system to its zero, or null position. This zero or null position can be accurately defined. The entire arrangement, particularly when applied to a galvanometer, can be so suspended that it is sturdy and essentially shock resistant, and will be free from damage due to vibration or impact and, yet, have a low inherent frequency in operation of the device. The opto-electronic system which senses the deflection does not apply a reactive force to the moving system, so that no feedback from the sensor to the moving system will result. The amplification factor of the electronic path of the signal between the photodetector and the combining circuit can be suitably selected so that the characteristics and reset characteristics of the instrument can be controlled.

DRAWINGS ILLUSTRATING A PREFERRED EXAMPLE

FIG. 1 is a highly schematic representation of the system in accordance with the invention, and FIG. 2 is a fragmentary, schematic representation of a variation of the system.

DETAILED DESCRIPTION

Figure 1:
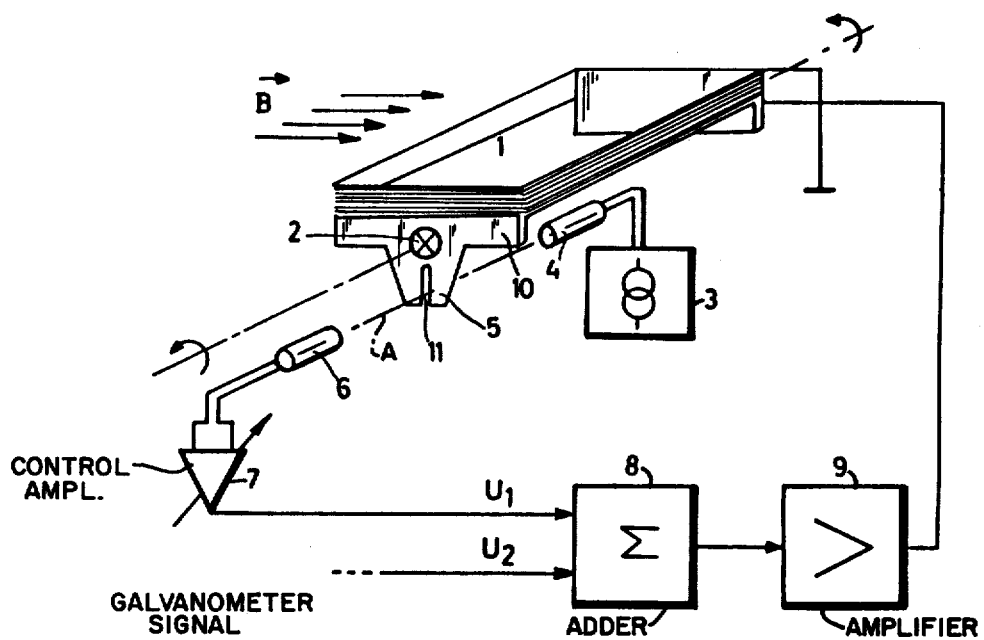

A galvanometer coil 1 is wound on a frame in standard and wellknown manner. The galvanometer coil 1 is suspended by cross-suspension ribbons, one at each end, one of which is seen at 2. It is movable in a magnetic field generally and schematically indicated by arrows B. The galvanometer frame 10 is formed with a projecting sheet element 5 which is formed with a slit 11. A light source 4, supplied by current from a source 3 projects a beam of light A through the slit 11 to an optical-electrical transducer 6, typically a photodetector. The output signal from the photodetector 6 is amplified in a variable gain control amplifier 7 and supplied in form of a correction signal $U_1$ to an adder circuit 8. The adder circuit 8 has the galvanometer signal $U_2$ applied thereto. The added voltage, forming an overall control signal is amplified in amplifier 9 to a suitable degree and then applied to the galvanometer winding 1.

Operation

Upon application of a signal $U_2$, and energization of source 3, a signal will be applied from light source 4 to the transducer 6, resulting in an optical output signal $U_1$. Upon deflection of the galvanometer coil due to the presence of a signal at the output of amplifier 9, the light beam A is partially blocked, thus changing the output signal derived from the amplifier 9. By suitable choice of the amplification factor of the preamplifier 7, and the sign of the correction voltage $U_1$ with respect to the signal or control voltage $U_2$, it is possible to so control the reset torque due to the ribbon suspension of the ribbons 2 connected to the frame 10 of the galvanometer, that the mechanical construction can be designed with a degree of sturdiness dependent only on mechanical requirements and entirely independent of electrical requirements due to considerations of reset torque or torque counteracting the deflecting current due to signal $U_2$. Consequently, the entire instrument becomes sturdier, more reliable, and more accurate.

The present invention is particularly applicable to suspension of a galvanometer, and has been described in connection with a galvanometer as the preferred example; it is, however, also applicable to other electromechanical suspensions. The dimension and shape of the slit, and its arrangement can be suitably selected, so that an edge partially, or entirely blocks the beam of light A. Other edges than those shown can be used. It is desirable, however, to so shape the edge that the proportionality of change in light current and deflection of the electromechanical element will be retained.

The output of the photoelectrical transducer 6, which may be a photodiode, a phototransistor, or the like is preferably so amplified in the control amplifier 7 that, upon substantial deflection, an addition signal is positively added to the galvanometer signal $U_2$, thereby counteracting the restoring or reset torque of the cross ribbon suspension 2. The deflection of the galvanometer coil 1 is schematically indicated by the rotating arrows about the center line of the suspension ribbon 2.

Figure 2:
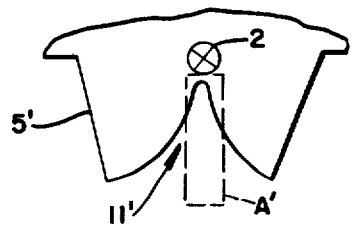

If the galvanometer is arranged for deflection over more than a few degrees then extension of the slits to a wider degree is desirable. FIG. 2 illustrates a slit 11', formed in a light gate element 5', and partially covering a sheet-like beam A' as the element 5' rotates about the axis of the suspension 2. By suitable shaping of the curve forming the slit 11' it is possible to match the signal $U_1$ upon linear amplification, to various elastic torsion characteristics of the ribbon suspension 2. If the ribbon suspension 2 is changed, for example, due to replacement or repair, or due to outside influences, for example temperature or shock, compensation for such changed elastic characteristics can also be affective by suitable change of the amplification transfer characteristics of the amplifier 7, for example.

We claim:

1. In an elastic suspension system for a positioning element, positioned under control of a positioning signal,
a method of compensation for elastic restoring torque upon deflection of the system
comprising the steps of
generating a beam of light (A,A') projected in an optical path from a light source (4) to a photo detector (6);
interrupting at least in part said beam of light by a blocking element (5, 11) directly coupled to the positioning element and located at least in part in said optical path;
deriving a deflection signal from the photo detector representative of change of the blocking position of the blocking element in said path upon mechanical deflection of the positioning element;
and combining said deflection signal, as a restoring torque compensation signal with the positioning signal.

2. In a positioning system having a positioning element (1) under control of a positioning signal ($U_2$), said positioning element being elastically suspended by an elastic suspension system (2),
means to compensate for the elastic restoring torque of said elastic suspension comprising
a light source (4);
a photodetector (6) located to receive a beam of light from said light source and provide a signal corresponding to received light;
and a movable light gate (5) directly coupled to said positioning element and movable in the path of the beam of light (A) between the light source and the photodetector (6) and controlling the intensity of light sensed by the photodetector as a function of the deflection of said positioning element
to there5y derive a deflection signal proportional to the deflection of said element under control of the positioning signal;
and electrical combining means (8, 9) combining said deflection signal and said positioning signal to form a combined signal having the positioning signal as a component and the deflection signal as another component and compensating at least in part for the restoring torque of said elastic suspension, said combined signal being applied to said positioning element.

3. System according to claim 2 wherein said electrical combining means comprises a control amplifier (7) and an adder (8), the adder combining the positioning signal and the deflection signal derived from said photodetector and furnishing said combining signal.

4. System according to claim 3 wherein the positioning element is a movable coil of a galvanometer;
and said light gate (5) comprises a blocking edge coupled to the frame of the galvanometer and movable in the path of the beam of light (A) between the source (4) and the photodetector to block projection of the light beam from the source unto the photodetector proportionately to deflection of the galvanometer movable coil.

5. System according to claim 2 wherein the positioning element is a movable coil of a galvanometer;
and said light gate (5) comprises a blocking edge coupled to the frame of the galvanometer and movable in the path of the beam of light (A) between the source (4) and the photodetector to block projection of the light beam from the source unto the photodetector proportionately to deflection of the galvanometer movable coil.

* * * * *